(12) United States Patent
Chandran

(10) Patent No.: US 7,501,081 B2
(45) Date of Patent: *Mar. 10, 2009

(54) NANOSTRUCTURED TITANIUM MONOBORIDE MONOLITHIC MATERIAL AND ASSOCIATED METHODS

(75) Inventor: K. S. Ravi Chandran, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,743

(22) Filed: Jan. 25, 2007

(65) Prior Publication Data

US 2007/0235701 A1    Oct. 11, 2007

Related U.S. Application Data

(63) Continuation-in-part of application No. PCT/US2006/018167, filed on May 10, 2006, which is a continuation-in-part of application No. 11/177,907, filed on Jul. 7, 2005.

(60) Provisional application No. 60/680,220, filed on May 10, 2005.

(51) Int. Cl.
*C22C 29/14* (2006.01)
*C22C 1/05* (2006.01)
*C04B 35/58* (2006.01)
*H01B 1/08* (2006.01)

(52) U.S. Cl. .............. 252/520.22; 252/500; 252/520.2; 89/36.02; 148/22; 148/27; 501/95.3; 501/96.3; 419/12; 419/48; 75/244; 423/297

(58) Field of Classification Search .............. 252/519.1, 252/500; 423/297; 501/95.1, 95.3, 96.1, 501/96.3; 428/357, 402, 403, 364; 427/216, 427/212; 75/144, 252, 254, 228; 148/513, 148/22, 27

See application file for complete search history.

(56) References Cited

U.S. PATENT DOCUMENTS 3,029,162 A    4/1962    Samuel et al.

(Continued)

OTHER PUBLICATIONS

Panda et al, "Titanium-Titanium boride (Ti-TiB) functionally graded materials through reaction sintering: Synthesis, microstructure, and Properties," Metallurgical and Materials Transactions-A, 2003, 34A(9), p. 1993-2003.*

(Continued)

*Primary Examiner*—Stanley Silverman
*Assistant Examiner*—Kallambella Vijayakumar
(74) *Attorney, Agent, or Firm*—Thorpe North & Western LLP

(57) ABSTRACT

A nanostructured monolithic titanium boride (TiB) material and methods of forming such a material are disclosed and described. This material has a room-temperature four-point flexural strength about three times that of commercially available titanium diboride ($TiB_2$). The achievement of nanostructured internal microstructural arrangement having a network of interconnected titanium monoboride whiskers affords a very high strength to this material above some of the best ceramic materials available in the market. The material contains a small amount of titanium and a densifier, but it is largely made of TiB phase with substantially no $TiB_2$. The nanostructured monolithic titanium boride material can be formed by high temperature processing of a powder precursor having carefully selected weight and size distributions of titanium powder, titanium diboride powder, and densifier powder. Potential applications of this material can include wear resistant components such as die inserts for extrusion dies, nozzles, armor, electrodes for metal refining etc. An important advantage of TiB over other hard ceramics is that TiB can be cut by electro-discharge machining (EDM) without difficulty, unlike most ceramics.

21 Claims, 9 Drawing Sheets

U.S. PATENT DOCUMENTS

| | | | |
|---|---|---|---|
| 3,147,543 | A | 9/1964 | Doerner et al. |
| 3,251,719 | A | 5/1966 | Tepper et al. |
| 3,634,145 | A | 1/1972 | Homan |
| 3,673,005 | A | 6/1972 | Kunst et al. |
| 3,676,371 | A | 7/1972 | Zollner et al. |
| 3,787,245 | A | 1/1974 | Kunst |
| 3,806,374 | A | 4/1974 | Krzyminski et al. |
| 3,809,583 | A | 5/1974 | Krzyminski |
| 3,870,569 | A | 3/1975 | Krzyminski |
| 3,936,327 | A | 2/1976 | Fichtl et al. |
| 3,937,619 | A | 2/1976 | Clougherty |
| 3,999,954 | A | 12/1976 | Kolaska et al. |
| 4,011,107 | A | 3/1977 | Hayes |
| 4,019,873 | A | 4/1977 | Reiter |
| 4,040,870 | A | 8/1977 | Holzl |
| 4,126,488 | A | 11/1978 | Kunst et al. |
| 4,268,582 | A | 5/1981 | Hale et al. |
| 4,289,545 | A | 9/1981 | Thevenot et al. |
| 4,353,885 | A | 10/1982 | Hoekje |
| 4,398,968 | A | 8/1983 | Koyama et al. |
| 4,402,764 | A | 9/1983 | Clark et al. |
| 4,404,045 | A | 9/1983 | Thevenot et al. |
| 4,459,328 | A | 7/1984 | Mizuhara |
| 4,528,121 | A | 7/1985 | Matsushita et al. |
| 4,536,224 | A | 8/1985 | Beyer et al. |
| 4,637,837 | A | 1/1987 | von Matuschka et al. |
| 4,673,550 | A | 6/1987 | Dallaire et al. |
| 4,692,385 | A | 9/1987 | Johnson |
| 4,844,949 | A | 7/1989 | Arai et al. |
| 4,857,116 | A | 8/1989 | Allam et al. |
| 4,906,430 | A | 3/1990 | Abkowitz et al. |
| 4,957,421 | A | 9/1990 | Baldi |
| 4,968,348 | A | 11/1990 | Abkowitz et al. |
| 4,971,624 | A | 11/1990 | Clark et al. |
| 5,118,026 | A | 6/1992 | Stacher |
| 5,158,913 | A * | 10/1992 | Saito et al. ............... 501/87 |
| 5,187,128 | A | 2/1993 | White et al. |
| 5,296,419 | A | 3/1994 | White et al. |
| 5,378,327 | A | 1/1995 | Sekhar et al. |
| 5,399,207 | A | 3/1995 | Kemp |
| 5,409,518 | A | 4/1995 | Saito et al. |
| 5,455,068 | A | 10/1995 | Aves et al. |
| 5,464,699 | A | 11/1995 | Baldi |
| 5,573,604 | A | 11/1996 | Gerdes |
| 5,620,521 | A | 4/1997 | Tachikawa et al. |
| 5,702,448 | A | 12/1997 | Buechel et al. |
| 5,745,990 | A | 5/1998 | Lee et al. |
| 5,799,238 | A | 8/1998 | Fisher, II et al. |
| 5,868,796 | A | 2/1999 | Buechel et al. |
| 5,966,585 | A | 10/1999 | Sue |
| 6,024,915 | A | 2/2000 | Kume et al. |
| 6,245,162 | B1 | 6/2001 | Baudis et al. |
| 6,287,711 | B1 | 9/2001 | Nieh et al. |
| 6,306,225 | B1 | 10/2001 | Hunger et al. |
| 6,428,885 | B1 | 8/2002 | Seitz et al. |
| 6,458,218 | B1 | 10/2002 | Savich |
| 6,478,887 | B1 | 11/2002 | Sue et al. |
| 6,503,344 | B2 | 1/2003 | Baudis et al. |
| 6,551,371 | B1 | 4/2003 | Furuta et al. |
| 6,770,358 | B2 | 8/2004 | Berger et al. |
| 2001/0041230 | A1 | 11/2001 | Hunger et al. |
| 2003/0047463 | A1 | 3/2003 | Ward-Close et al. |
| 2003/0099762 | A1 | 5/2003 | Zhang et al. |
| 2005/0208213 | A1 | 9/2005 | Chandran et al. |
| 2006/0137517 | A1 | 6/2006 | Palicka et al. |

OTHER PUBLICATIONS

Sahay et al, "Evolution of microstructure and phases in in situ processed Ti-TiB composites containing high volume feactions of TiB Whiskers," J. Mater. Res. 1999, 14(11), pp. 4214-4223.*

Panda et al, "Synthesis of Ductile Titanium-Titanium Boride (Ti-TiB) Composites with a Beta-Titanium matrix: The Nature of TiB Formation and Composites Properties," Met. Mat. Trans A, 2003, V34A, pp. 1371-1385.*

Chandran et al, "TiBw-Reinforced Ti Composites: Processing, Properties, Application Prospectus, and Research Needs," JOM,2004, 56(5), pp. 42-48; TMS Pubs.*

Monolith, Webster Merriam Dictionary, 2008, p. 1-3.*

Aich, S. et al., "TiB Whisker Coating On Titanium Surfaces by Solid-State Diffusion: Synthesis, Microstructure, and Mechanical Properties", Metallurgical and Materials Transactions A (2002) vol. 33A, pp. 3489-3498.

Fan, Z. et al., "The kinetics and mechanism of interfacial reaction in sigma fibre-reinforced Ti MMCs", Composites Part A (1997) vol. 28A, pp. 131-140.

Hill, Michael R. et al. "Fracture Testing of a Layered Functionally Graded Material" Fracture Resistance Testing of Monolithic and Composite Brittle Materials, ASTM STP 1409, J.A. Salem, G.D. Quinn and M.G. Jenkins, Eds., American Society for Testing and Materials, 2002, West Conshohocken, PA.

Sahay, S.S. et al., "Evolution of microstructure and phases in in situ processed Ti-TiB composites containing high volume fractions of TiB whiskers", J. Mater. Res. (Nov. 1999) vol. 14, No. 11, pp. 4214-4223.

Yang, Y.Q. et al., "TEM investigations of interfacial processes in SCS-6 SiC/TiB2/Super α 2 composites", Composites: Part A (1999) vol. 30, pp. 1209-1214.

Alman, D.E. et al., "The Abrasive Wear of Sintered Titanium Matrix-Ceramic Particle Reinforced Composites", Wear, 1999, vol. 225-229, pp. 629-639.

Ueda, N. et al., "Boriding of Nickel by the Powder-Pack Method", Surface and Coatings Technology, 2000, pp. 25-30, vol. 126.

Jain, Vipin, et al., Influence of the Pack Thickness of the Boronizing Mixture on the Boriding of Steel, Surface and Coatings Technology, 2002, pp. 21-26, vol. 149.

Kooi, B.J. et al., "The Evolution of Microstructure in a Laser Clad TiB-Ti Composite Coating", Acta Materialia, 2003, pp. 831-845, vol. 51.

Matiasovsky, K. et al., "Electrochemical and Thermochemical Boriding in Molten Salts", Surface and Coatings Technology, 1988, pp. 133-149, vol. 35.

Matuschka, Alfred Von Graf, "Boronizing", Heyden & Son, Inc. Philadelphia, 1980, pp. 11-31.

Meric, Cevdet et al., "Investigation of the Effect on Boride Layer of Powder Particle Size Used in Boronizing with Solid Boron-Yielding Substances", Materials Research Bulletin, 2000, pp. 2165-2172, vol. 35.

Sioshansi, Piran, "Improving the Properties of Titanium Alloys by Ion Implantation", Applied Technology, Mar. 1990, pp. 1-2.

Sup Lee, Chang et al., "Improved of Hardness and Water Resistance of (TiC, TiB)/Ti-6Al-4V Surface-Alloyed Materials Fabricated by High-Energy Electron-Beam Irradiation, Metallurgical and Materials Transactions", Jul. 2003, pp. vol. 34A.

Atri et al., "Elastic properties of in-situ processed Ti-TiB composites measure by impulse excitation of vibration," Materials Science and Engineering, A, Structure Materials: properties microstructure and processing, 1999, V 271, No. 1-2, pp. 150-159, Abstract only.

* cited by examiner

NANOSTRUCTURED TITANIUM MONOBORIDE MONOLITHIC MATERIAL AND ASSOCIATED METHODS

RELATED APPLICATIONS

This application is a continuation-in-part of PCT Application No. PCT/US06/18167 filed May 10, 2006, which is a continuation-in-part to U.S. patent application Ser. No. 11/177,907, filed Jul. 7, 2005, which claims benefit to U.S. Provisional Patent Application No. 60/680,220 filed May 10, 2005, which are each incorporated in by reference in their respective entireties.

BACKGROUND OF THE INVENTION

Hard ceramic materials such as oxides, carbides, nitrides and borides are engineered materials having high melting or decomposition temperature, high hardness, strength and wear resistance and resistance to high temperature oxidation and degradation as well as resistance to corrosive chemicals such as acids and bases. These ceramic materials have found applications in tools, dies, grinding media, heating elements, furnace insulations, thermal shields, high temperature probe sheathing, and variety of other demanding applications. In particular, the group of compounds known as metal borides are exceptionally hard and chemically inert and are very attractive candidates for high technology applications which require high performance as indicated above. Some known borides are titanium diboride ($TiB_2$), iron boride (FeB), chromium boride (CrB), molybdenum boride (MoB), tantalum boride (TaB), zirconium boride ($ZrB_2$) and hafnium boride ($HfB_2$). Of these, only titanium diboride is widely manufactured commercially due to its high melting temperature, hardness and wear resistance as well as electrical conductivity. Other borides are not widely available due to difficulties in making pure and dense materials, as well as attendant high manufacturing costs.

Commercially, titanium diboride is first manufactured as a powder by reacting titanium oxide with boron. The pure titanium diboride powder is then consolidated by hot pressing above 2200° C. under pressure of several thousand Pascals to produce bulk and solid material. The higher temperatures and pressures involved make this material quite expensive. Hence, use of this material has been limited to specialized and value-added markets. Although the high hardness (3200 $Kg/mm^2$ Vickers hardness) is attractive, hardness exceeding 2000 $Kg/mm^2$ is seldom required in common applications. Additionally, the high cost of making titanium diboride, as well as difficulties in obtaining fully densified titanium diboride limits its flexural strength to about 300 MPa and its use to applications where there is no viable alternative.

There have been efforts focused on providing titanium alloys reinforced with titanium monoboride whiskers and such materials which have improved hardness and wear resistance characteristics relative to titanium. For example, a number of researchers have formed titanium metal having titanium monoboride needles distributed throughout the titanium matrix. Further, some attempts have been made to produce materials having a high content of titanium monoboride. However, typically, such materials also have substantial amounts of residual titanium metal and titanium diboride which significantly reduces the strength of the titanium monoboride material.

Silicon nitride is among the strongest materials for similar wear resistant applications and can have strength of about 700 MPa. Further, it has a hardness of about 1800 $Kg/mm^2$. However, silicon nitride is not electrically conductive, which means making of complex shapes and profiles is to be done by diamond-based machining which is complicated and expensive. Further, titanium diboride which is another common material for use in wear resistant applications, requires process temperatures above 2200° C. in order to form the material. Achieving full density is cumbersome, requiring even higher temperatures, pressures, and process times. Additional problems are more coarse grains and non-uniform grain structure which are some of the causes of relatively low strength (<300 MPa) titanium diboride. The high temperatures and pressures required significantly increase the costs of manufacture.

For this and other reasons, the need remains for methods and materials which can provide new or improved materials for use where extremely high strength alloys are required, which have decreased manufacturing costs and avoid the drawbacks mentioned above.

SUMMARY OF THE INVENTION

It would therefore be advantageous to develop improved materials and methods which produce a titanium and boron containing monolithic material having significantly increased strength, machinability, and ease of manufacture. The present invention provides methods and materials which produce nanostructured high strength titanium monoboride monolithic material which satisfies many of the above criteria.

Titanium diboride ($TiB_2$) containing one titanium atom and two boron atoms in the chemical structure is a commercially manufactured and widely used ceramic material. Titanium monoboride (TiB) is a similar compound, but is made of one boron atom along with one titanium atom in the chemical structure. Titanium monoboride whiskers infiltrating into a titanium mass was previously synthesized by the inventor as a coating structured on titanium surfaces as described in International Patent Application No. WO 2004/046262, which is incorporated herein by reference. However, the present invention provides an avenue for production of not previously available or produced monolithic bulk titanium monoboride being substantially free of titanium diboride. Methods for improved synthesis are described in detail along with an evaluation of several useful properties of the titanium monoboride as a monolithic bulk material. Flexural strength evaluations suggest that at room temperature, the titanium monoboride material is about three times stronger than $TiB_2$. This increase in strength arises largely from the extremely fine nanostructure structure of the material and the absence of substantial amounts of titanium diboride.

The titanium boride (TiB) material of the present invention has about three times the flexural bend strength compared to commercially available titanium diboride ($TiB_2$) ceramic material. This is quite unusual and highly desired in hard material applications for wear and erosion resistance as well as for electrodes in metal refining. There are only a few other ceramics with this high level of strength. In addition, the titanium monoboride material of the present invention can be machined by electrical discharge machining which allows for economical formation into a wide variety of shapes.

In general, the titanium monoboride of the present invention can be highly useful in any material applications where wear and erosion resistance is required. Examples are dies and inserts in metal processing industries (casting and forming etc.), electrodes in aluminum and magnesium extraction, nozzles, armor, and the like.

In one aspect of the present invention, a titanium monoboride article can include titanium monoboride whiskers which are present at a volume content greater than about 80%. Further, the titanium monoboride article can also include a densifier and be substantially free of titanium diboride. The nanostructured titanium monoboride articles of the present invention can be readily machined using electrical discharge machining due to electrical conductivity of titanium monoboride.

The nanostructured monolithic titanium monoboride articles can be manufactured by forming a powder precursor which includes titanium powder, titanium diboride powder, and densifier powder. The specific composition and microstructure of the powder precursor can govern the process conditions necessary to achieve the desired nanostructure. Typically, the powder precursor can have a titanium powder to titanium diboride powder weight ratio from about 0.8:1 to about 1.2:1. The powder precursor can be maintained under a temperature and pressure sufficient to grow titanium monoboride whiskers. Temperatures from about 1100° C. to about 1400° C. are typically sufficient to achieve the desired nanostructure. The monolithic titanium monoboride can then be recovered as a material which is substantially free of titanium diboride and has titanium monoboride whiskers present at a volume content greater than about 80%.

Additional features and advantages of the invention will be apparent from the following detailed description, which illustrates, by way of example, features of the invention.

Figure 1:
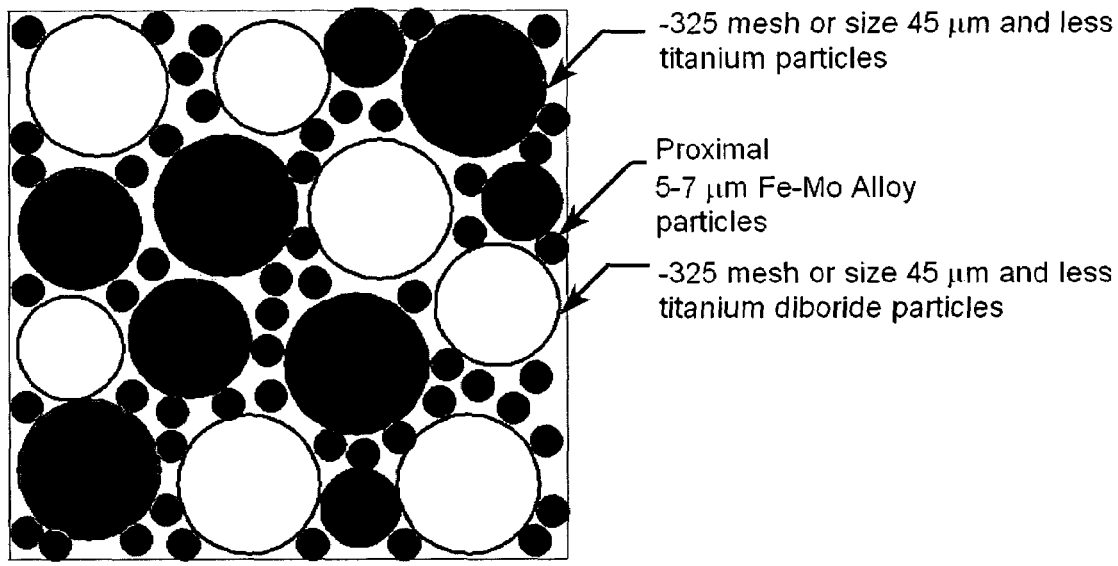
FIG. 1 is an illustration of a bi-modal size distribution of powder particles in the powder precursor in accordance with one embodiment of the present invention.

It should be noted that the figures are merely exemplary of several embodiments of the present invention and no limitations on the scope of the present invention are intended thereby.

DETAILED DESCRIPTION

Reference will now be made to exemplary embodiments and specific language will be used herein to describe the same. It will nevertheless be understood that no limitation of the scope of the invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

Definitions

In describing and claiming the present invention, the following terminology will be used.

The singular forms "a," "an," and "the" include plural references unless the context clearly dictates otherwise. Thus, for example, reference to "a powder precursor" includes reference to one or more of such materials, and "a densifier" includes reference to one or more of such materials.

As used herein, "titanium" without an accompanying element is intended to refer to elemental titanium in the zero oxidation state. Thus, terms such as "titanium powder" and "titanium" refer to elemental titanium and specifically exclude titanium compounds such as titanium diboride, titanium monoboride, etc.

As used herein, "whisker" refers to a nanostructure having a high aspect ratio, i.e. the length to diameter ratio greater than about 5:1. Typically, whiskers have a generally polygonal cross-section; however cross-sections may vary somewhat, e.g., hexagonal, diamond, and circular. Whisker diameters are most frequently in the nanometer range; however diameters can vary from about 50 nm to about 3 µm, although preferred diameters are from about 100 nm to about 600 nm.

As used herein, "nanostructure" is intended to indicate that at least one physical dimension of the material is in the nanometer range, i.e. less than 1 μm, and preferably less than about 800 nm.

As used herein, "monolithic" refers to a material which can be formed or cast as a single piece. Typically, monolithic materials have a relatively uniform composition throughout, i.e. substantially free of joints, layers or the like, although other materials can be subsequently joined thereto.

As used herein, "densifier" refers to a filler material which acts to increase density and decrease porosity of the article. Typically, the densifier is an active material which not only contributes to packing efficiency but also facilitates and participates in whisker formation as described more fully herein.

As used herein, "packing factor" refers to the ratio of volume occupied by solids to volume of a unit cell. Thus, a packing factor for mixtures of particles is independent of absolute size and is directly related to relative sizes. A packing factor of 1.0 would indicate 100% solid with no voids which is not achievable using spherical particles.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 μm to about 200 μm should be interpreted to include not only the explicitly recited limits of 1 μm and about 200 μm, but also to include individual sizes such as 2 μm, 3 μm, 4 μm, and sub-ranges such as 10 μm to 50 μm, 20 μm to 100 μm, etc.

Titanium Monoboride (TiB) Articles

In accordance with the present invention, a titanium monoboride article can include a densely packed mass of titanium monoboride whiskers as a bulk material. The titanium monoboride whiskers can be present at a volume content greater than about 80% such that the primary constituent of the article is titanium monoboride whiskers which are intergrown and form an interconnected network of nanostructure whiskers. Further, the titanium monoboride articles of the present invention can be substantially free of titanium diboride. The substantial elimination of titanium diboride from the final product can be achieved using the methods described in more detail below. In one aspect, the titanium monoboride articles of the present invention can consist essentially of the titanium monoboride whiskers and titanium. In a detailed aspect, the titanium monoboride article can be completely free of titanium diboride.

The nanostructure of the present invention is one important aspect which determines the beneficial extraordinary improvements in strength and mechanical properties. The volume content of titanium monoboride whiskers and the dimensions of such whiskers typically should fall within certain ranges in order to achieve the desired results. For example, although many titanium monoboride articles of the present invention containing greater than about 80% by volume of whiskers can be beneficial, the titanium monoboride articles are characterized by a high titanium monoboride whisker content. Typically, the titanium monoboride whisker volume content can be from about 85% to about 95%, and is preferably from about 88% to about 93%. In addition, the titanium monoboride whiskers can have a nanostructure wherein the average diameter of the titanium monoboride whiskers is from about 10 nm to about 900 nm, and preferably from about 20 nm to about 200 nm. It is thought that the whisker nanostructure of these articles is largely responsible for the increase in mechanical strength. Typically, the titanium monoboride whiskers can have an average length of from about 1 μm to about 700 μm, and frequently from about 2 μm to about 300 μm. The length of the whiskers is sufficient to allow most of the titanium monoboride whiskers to form an interconnected network. In an additional related measure of the nanostructure, the titanium monoboride whiskers can have an average aspect ratio from about 5:1 to about 500:1, although other aspect ratios can be suitable.

In one aspect of the present invention, the titanium monoboride articles can further include a densifier and other optional components. A densifier can typically comprise a minor amount of the final product and is most often in the range of 5 to 20 wt. %, preferably about 10%.

In yet another aspect of the present invention, the titanium monoboride articles are electrically conductive. This electrical conductivity is relatively unique among ceramics. For example, ceramics such as silicon nitride or silicon carbide are not sufficiently conductive to allow machining via electrical discharge machining (EDM). Thus, such materials are usually machined using relatively expensive superabrasive tools such as diamond tools. In contrast, the nanostructured titanium monoboride articles of the present invention can be readily machined using EDM such that highly complex or simple shapes can be formed without the need for expensive diamond tools.

EXEMPLARY MANUFACTURING METHODS

The specific process and conditions for formation of the titanium monoboride articles of the present invention can be carefully chosen and implemented in order to achieve the nanostructured titanium monoboride. In one aspect, a method of forming a monolithic titanium monoboride having a whisker nanostructure can include forming a powder precursor.

Suitable powder precursors include titanium powder and titanium diboride powder. In order to achieve the desired nanostructure and absence of titanium diboride, the relative powder sizes and weight ratio are important. In addition, the powder precursor can have a titanium powder to titanium diboride powder weight ratio from about 0.8:1 to about 1.2:1. Weight ratios from about 0.9:1 to about 1.1:1 can also be used. However, currently preferred formulations of the powder precursor include a greater amount of titanium diboride by weight such as about 0.95:1 to about 0.99:1, and most preferably about 0.96:1. A ratio of about 0.96:1 corresponds to a weight ratio of 49:51 when the powder precursor consists essentially of titanium powder and titanium diboride powder. Typically, weight ratios within about +/−2 wt % of the 49:51 ratio are preferred. These ratios can be adjusted to account for any substantial presence of other elements such as Zr, O, N, C, Fe, and the like.

As mentioned herein, the particle sizes of the respective powders can also govern the ability of the powder precursor to form nanostructured titanium monoboride, as well as can affect the process temperature and process time. Further, careful selection of relative powder sizes can help to achieve more uniform whisker growth and allow the extent of reaction to be driven to completion at the lowest possible process temperature. However, as a general guideline, the titanium powder can have a particle size from about 5 µm to about 100 µm, and preferably about 45 µm. Similarly, the titanium diboride powder can have a particle size from about 1 µm to about 4 µm, and preferably about 2 µm. Thus, in some embodiments, the titanium powder can have a particle size significantly greater than the particle size of the titanium diboride. Typically, the titanium powder can have a particle size from about 5 to about 100 times that of the titanium diboride, and most often from about 8 to about 15 times. However, in other embodiments, the sizes of the titanium and titanium diboride powders can be approximately equal when a densifier is also included.

Additives can also be included to form the powder precursor. However, such additives must be carefully chosen so as to not interfere with whisker growth or consolidation. The addition of densifier powders can help to decrease porosity of the final product and can contribute to the porosity reduction effect of multimodal packing described herein. Densifier powders can have particle sizes which are consistent with the above discussion regarding packing. In some embodiments, a densifier can be used with or without trimodal packing. Therefore, in some embodiments the powder precursor can comprise or consist essentially of titanium powder, titanium diboride powder, and a densifier. The resulting products can thus consist essentially of titanium, titanium monoboride whiskers, and a minor amount of the densifier incorporated into the whisker structure. The densifier can be any material which acts to increase density and preferably without interfering with whisker growth. Further, the densifier preferably has a melting point below the process temperatures used for whisker growth. Also, a suitable densifier will not form borides more readily than TiB at the process temperatures and pressures. In another alternative aspect, a metal or alloy densifier preferably forms a eutectic liquid with titanium and/or boron. In one embodiment, the densifier can include, or consist essentially of, a metal, a combination of metals, or an alloy which forms a eutectic liquid at temperatures from about 600° C. to about 1300° C. Suitable specific alloys beyond those discussed herein can be identified by examining the phase diagrams and relative reactivity of elements with titanium and/or boron. For example, a powder densifier such as pure Fe, pure Mo or Fe alloys such as Fe—Mo can be added as part of the powder precursor. Non-limiting examples of other potentially suitable densifiers includes elements such as Al, Ga, Sn, Mn, Cr, V, P, S, Fe, Mo either alone or in combination and alloys such as Fe—Mo, Fe—Cr, Fe—V, Fe—Sn, Fe—Ga, Fe—Mn, and combinations thereof. It has been found that Fe—Mo as an additive can allow densification of the nanostructured TiB in a much shorter time. For example, addition of about 10 wt % Fe—Mo powders can help reduce the process time from about 2 hours to about 30 minutes or less at the process temperature discussed herein. Amounts of Fe—Mo in the range of 5-20 wt. % can be added to the powder precursor without causing any significant change in the amount of TiB, or its structure or morphology in the processed material. A currently preferred Fe—Mo powder composition is Fe: 40% and Mo: 60% by weight, although other Fe—Mo compositions can also be suitable. Generally, from about 0.5 wt % to about 20 wt % of a densifier can be added, and in other cases about 5 wt % to 12 wt %.

Without being bound to any particular theory, there appears to be no competitive growth of FeB or MoB because temperature and pressure conditions are not suitable for the formation of FeB and MoB, and titanium is more reactive with boron as compared to that of Fe/Mo with boron under the desired process conditions. The atoms of Fe and Mo from the Fe—Mo additive are atomically incorporated inside the TiB crystal lattice and in the residual titanium if any. Thus, there is substantially no change in the structure and morphology of the TiB nanostructured material, because Fe and Mo atoms, after helping to decrease the porosity, are absorbed into the material itself. This absorption takes place in a way that does not change the basic crystal structure of TiB. Specifically, Fe and Mo can form bonds with B atoms in a way that is similar to the formation of bonds between Ti and B inside the TiB crystal structure. The amount of Fe—Mo added can be sufficiently small so as to not cause substantial change in the mechanical properties of the final product. The mechanism by which Fe—Mo additive decreases the porosity is by forming a liquid phase near the process temperature. The melting temperature of the alloy of composition: Ti-34 wt. % Fe is about 1070° C. It appears that the Fe from the Fe—Mo additive, by reacting with the titanium powder, leads to the formation of a liquid of this alloy (Ti-34 wt. % Fe) composition along the interstices of the powders. In the case of Fe—Mo addition, a liquid is formed anywhere from 900° C. to 1300° C., depending on the local dilution of Fe—Mo with the titanium and boron atoms. The liquid, formed shortly before the process temperature is reached, allows a quicker dissolution and diffusion of B from titanium diboride particles and the continued transport of B to the titanium powder sites to form the nanostructured TiB. Typically, the densifier and other optional additives can shorten the time for the formation of a fully dense product. In a variant of this process, separate densifier powders, e.g. Fe and Mo elemental powders, can be used although care should be taken to avoid non-uniform titanium monoboride whisker thickness in the monolithic material.

In one alternative aspect of the present invention, the powder precursor can have a multimodal size distribution. Typically, the powder precursor can have a bimodal size distribution although a trimodal size distribution can also be suitable.

In one embodiment, the powder precursor can include a multimodal distribution of particle sizes formed of a quantity of titanium powder, a quantity of densifier powder, and a quantity of titanium diboride powder in a size ratio of X:Y:Z, respectively. The particular choice of X, Y and Z can depend on the desired final product. However, as a general guideline, X can be from about 20 to about 100, Y can be from about 2 to about 15, and Z can be about 0.5 to about 55.

In one currently preferred embodiment, the size of titanium and titanium diboride can be substantially the same. FIG. 1 illustrates one example of a packing distribution in accordance with this embodiment where the titanium and titanium diboride particles are approximately the same size. This can allow for the use of readily available particle sizes without the need for milling or sizing. The corresponding size of the densifier in these embodiments can be substantially smaller than that of both the titanium and titanium diboride powders. Typically, the ratio of X:Y can be from about 5:1 to about 10:1, and preferably about 6:1 to 7:1.

Figure 2:
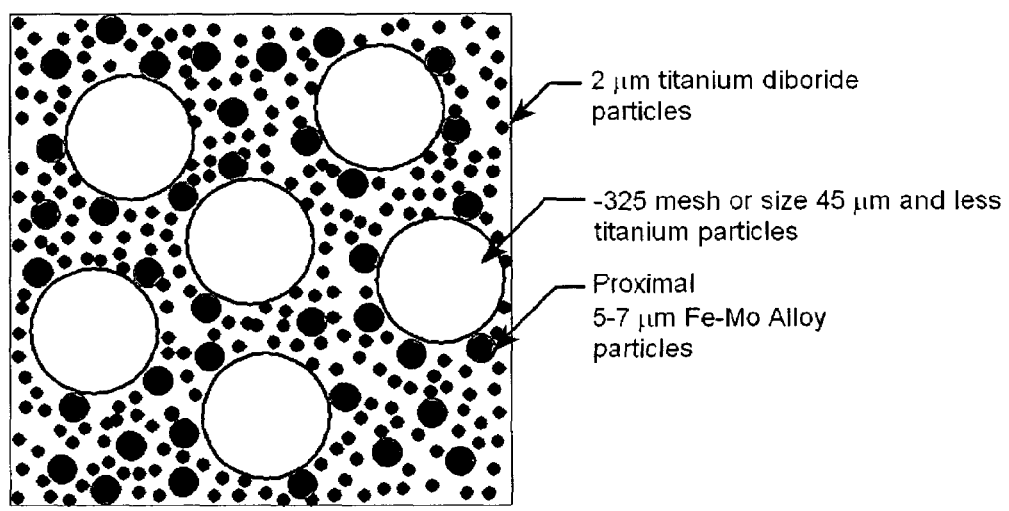
FIG. 2 is an illustration of a tri-modal size distribution of powder particles in the powder precursor in accordance with one embodiment of the present invention.

In another embodiment, the multimodal distribution can be a trimodal distribution where X is from about 35 to about 55, Y is from about 2 to about 15, and Z is from about 1 to about 5. Currently, the most preferred distribution in this embodiment is X of about 45, Y of about 5 to 7, and Z of about 2 which corresponds to a relatively high theoretical packing density. FIG. 2 illustrates a packing arrangement for such a trimodal distribution where each of the titanium, titanium diboride, and densifier powder have distinct and different size ranges and the densifier is an intermediate size range between that of the titanium and titanium diboride powders.

Figure 3:
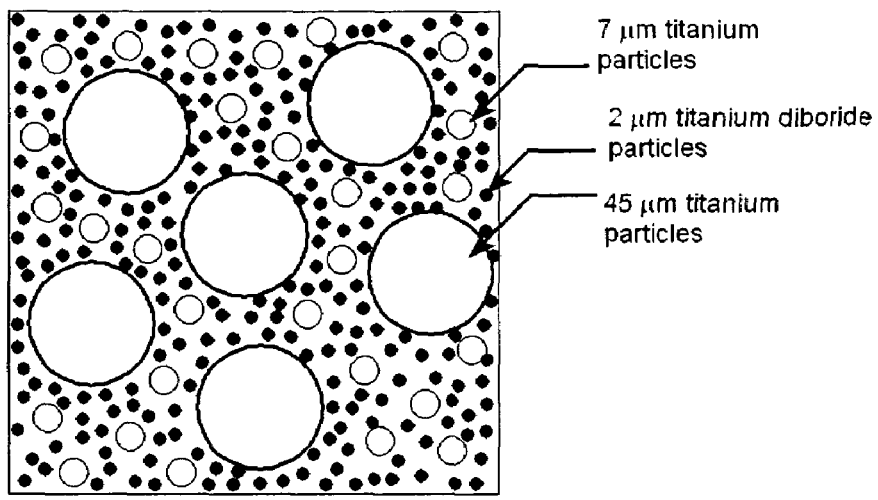
FIG. 3 is an illustration of a tri-modal size distribution of powder particles in the powder precursor having two different sizes of titanium particles in accordance with one embodiment of the present invention.

In another alternative embodiment, the titanium powder can include titanium powders having at least two different sizes. In one aspect, the titanium powder can have two different sizes. FIG. 3 provides an illustration of a packing arrangement having two different sizes of titanium powders. Although additional quantities of titanium powder and/or titanium diboride powder at different sizes can be added to the titanium powder, only minor improvement in results is achieved. One tri-modal size distribution that has proven effective includes a first quantity of titanium powder, a second quantity of titanium powder, and a titanium diboride powder in a size ratio of X:Y:Z, respectively, where X is from about 35 to about 55, Y is from about 2 to about 15, and Z is from about 1 to about 5. Preferably, X can be from about 40 to about 50 and Y from about 5 to about 10, and most preferably a ratio of 45:7:2 can be used.

As mentioned above, providing a tri-modal size distribution is one factor which allows the production of nanostructured titanium monoboride monolithic material in accordance with the present invention. Although the invention is not specifically limited thereto, it has been found very difficult to achieve uniform growth and substantial elimination of titanium diboride using bi-modal size distributions (i.e. titanium powder and titanium diboride powder each of a single average size). However, as mentioned herein, a bimodal distribution can be preferred when a densifier powder is included. At least part of the reason for this is the influence of packing density on the ability of titanium and boron to migrate and react. Thus, the formation of the powder precursor is a careful balance of packing density and access of boron to titanium to form titanium monoboride whiskers. Access of boron to titanium is at least partially governed by the relative proportions of titanium and titanium diboride, as well as the relative particle sizes.

In tri-modal mixtures of solid state powders, the packing density is a strong function of the particle size ratios of the three powders. A proper selection of the powder sizes, to achieve maximum packing before sintering, is important in achieving high density, complete reaction, and uniform distribution of the nanostructure in the TiB monolithic material. The mathematical formula, given in R. M. German, Powder Packing Characteristics, Published by Metal Powder Industries Federation, Princeton, N.J., 1994, p. 183, which is incorporated herein by reference, for powder-packing density (f) for a generic tri-modal powder, is given in Equation 1.

$$f = 0.951 - 0.098A_1 + 0.098A_2 - 0.198A_1A_2 \quad (1)$$

$$\text{where } A_1 = \exp\left(-0.201\frac{D_L}{D_M}\right), A_2 = \exp\left(-0.201\frac{D_M}{D_S}\right),$$

and $D_S$, $D_M$ and $D_L$ are the diameters of the small, medium and the large particles, respectively. According to Equation 1, for tri-modal powder mixtures, the maximum possible packing density attainable in the present tri-modal packing is about 92-93%, which is quite high compared to conventional powder processing in industrial operations that use mostly mono-sized powders. For example, one embodiment of the tri-modal mixtures used in the present invention has a particle size ratio of 45:7:2 (large to medium to small) which is very close to the theoretical maximum size ratio of 49:7:1, for obtaining a maximum packing density. This tri-modally packed powder configuration has an initial packing density that is quite close to the ideal packing density. The maximization of powder packing density is one important factor in achieving a full densification, complete reaction, absence of remnant unreacted $TiB_2$ particles, and uniform distribution of the nanostructure in the present TiB monolithic material. Additional sized powders can also be included, for example, by having a plurality of powder sizes for the titanium, titanium diboride, and/or the densifier. However, this also increases complexity of the process.

FIGS. 1 through 3 illustrate various aspects of particle packing and the particle-surrounding-mechanism that can be considered in choosing the multi-modal powder packing to manufacture the present nanostructured monolithic material. When the present tri-modal powders are blended thoroughly, both the large (e.g. 45 micron) as well as small size (e.g. 7 micron) titanium and/or densifier powders will be completely surrounded by smaller titanium diboride particles. This spatial arrangement enables uniform contact between titanium and titanium diboride particles, allowing uniform reaction and formation of TiB whiskers. This distribution of particles is also important to have complete reaction and prevent any residual $TiB_2$ particles. Without being bound to any particular theory, it is thought that the medium size titanium particles will act as the genesis of whisker growth and the larger titanium and smaller titanium diboride particles will act dominantly as raw material sources from which material diffuses toward growth areas. Additionally, the medium size titanium particles allow for increased packing density above that possible using a bi-modal size distribution. In one aspect of the present invention, the tri-modal size distribution can be determined by optimizing packing density using Equation 1 to within about 5% of the theoretical maximum packing density.

Referring again to FIG. 1, it is noted that even though the powder packing arrangement is not optimized through the use of a trimodal distribution, the densifier such as Fe—Mo can still facilitate production of a dense and strong nanostructured titanium boride after reaction. In particular, the densifier particles are proximal to almost all of the titanium and titanium diboride particles. One role of the Fe—Mo densifier powder is to produce a liquid phase around 900° C. which is maintained at high temperatures. This results in a liquid-bridge between a titanium particle and neighboring titanium diboride particles, enabling faster reaction. The liquid phase can allow faster diffusion of titanium and boron atoms and helps convert the material to nanostructured titanium boride quickly, eliminating the need for strict trimodal packing. The densifier thus acts as a densifying agent as well as an activating agent to obtain dense nanostructured titanium boride articles of the present invention. Final densities greater than 99% of theoretical density can be achieved. Although porosity can vary depending on the particular precursor powder composition and process conditions, typical porosities (i.e. void fraction) of the final article can range from about 0.005 to about 0.05 and preferably from about 0.01 to about 0.1.

The titanium powder, titanium diboride powder, and densifier powders can then be blended to obtain a substantially homogeneous powder mixture. This can be accomplished by mixing using a high shear mixer, ball mill or rotary blender with steel balls, or the like. The powder mixture can be pressed or consolidated to form the powder precursor to reduce porosity. Although the specific powder precursor can vary in properties, typically, the precursor can have a packing density from about 88% to about 95%, and preferably about 90%.

Almost any suitable commercial source can be used to obtain the above powders. Alternatively, the powders can be formed using any number of powder synthesis processes. However, regardless of the commercial source of such powders, the powders typically include nominal amounts of impurities such as O, N, C, Fe, Zr, H, and the like. Some of these impurities can be removed by baking the powders in vacuum or other such decontamination treatments. Typically, such impurities in an amount less than about 1% total (preferably less than about 0.8% total) impurities does not significantly affect ultimate performance of the nanostructured titanium monoboride articles.

The powder precursor can then be maintained under a temperature and pressure sufficient to grow titanium monoboride whiskers. As a general guideline, the specific process temperature strongly affects the shape and diameter of the whiskers. In accordance with the present invention, the process temperature can be from about 1200° C. to about 1400° C., and preferably from about 1250° C. to about 1350° C. In one aspect where the titanium powder is about 45 μm and the titanium diboride powder is about 2 μm, the process temperature can be about 1300° C. Similarly, the pressure can range from about 20 MPa to about 30 MPa, and preferably about 28 MPa. In an alternative aspect, the tri-modal packing of powders with densifier can allow a process temperature down to about 1000° C.

The powder precursor can be heated under pressure and maintained thereat for a time which is sufficient to form titanium monoboride whiskers having the desired nanostructure. Similarly, process time can influence whisker length and thus the thickness of the surface hardened region. Increasing process times can also result in a thickening of the whiskers. Typically, the process time can range from about one and a half to about three hours, and preferably about two hours. However, this process time can vary depending on the particle size, pressure and densifier content.

Additionally, the powdered precursor can be heated to the appropriate process temperature at a rate of about 30° C./minute. Those skilled in the art will recognize, however, that this is merely a guideline and that temperatures and times outside those indicated may also be used to achieve the desired nanostructure.

As an additional consideration in designing the process to achieve the desired nanostructure, the particle size of each constituent can affect the process temperature and process time needed to achieve the desired nanostructure and composition. Incorrect performance and/or determination of the process temperature or time based on a given powder precursor can result in unacceptable products. For example, process times in excess of the appropriate time can result in the titanium monoboride whiskers to thicken or grow together to form solid portions such that the whisker nanostructure is lost. Conversely, excessively short process times can leave the whiskers insufficiently interconnected and further allow residual titanium diboride to remain in the matrix. An inappropriate temperature can also prevent the significant formation of high volume contents of titanium monoboride whiskers. The necessary process time and temperatures can be determined based on calculations which take these variables into account.

On the basis of diffusion data, the time needed to form TiB whisker phases by the reaction between titanium and $TiB_2$ powders can be determined. The growth of TiB phase follows a parabolic relationship described in Equation 2.

$$x = k\sqrt{t} \tag{2}$$

where x is the length of the whiskers, k is the growth rate, and t is the process time. The temperature dependence of TiB whisker growth rate can be expressed as using Equation 3.

$$k = k_0 \exp\left(-\frac{Q_k}{2RT}\right) \tag{3}$$

where $k_0$ is a constant (experimentally determined frequency factor), $Q_k$ is the activation energy for growth, T is the temperature, and R is the universal gas constant (i.e. 82.05 cm³ atm/K/mol). The values of $k_0$ and $Q_k$ were found to be 17.07× $10^{-4}$ m/√sec and 190.3 kJ/mole in Z. Fan, Z. X. Guo, and B. Cantor: *Composites*, 1997, vol. 28A, pp. 131-140, which is incorporated herein by reference. From these values, the computed k values at 1300° C. and 1100° C. are 40.96×$10^{-8}$ m/√sec and 118.2×$10^{-8}$ m/√sec, respectively. From these data, the estimated lengths of the TiB whiskers that can form after 2 hrs, assuming direct Ti—$TiB_2$ contact, are about 99 μm at 1300° C. and 34 μm at 1100° C. However, experiments reveal that the growth of TiB substantially ceases after reaching length values of about 40-45 microns and 10-15 microns for the powder mixtures pressed at 1300° C. and 1100° C., respectively. These values are roughly half of the estimated values. This suggests that TiB growth is fully complete prior to the theoretical two hour process time and that the present TiB material can be formed in about one hour process time, to get nearly the same microstructures. However, shorter times can result in remnant $TiB_2$ which will disrupt the uniformity of the nanostructure; therefore, preferably, process times of up to about two hours can be used in order to ensure that all $TiB_2$ will be fully converted into TiB. As a general guideline, process times from about half the theoretical process time to about 1.2 times the theoretical process time are preferred. However, longer process times up to 24 hours do not generally adversely affect the nanostructure and the properties.

Generally, upon heating the powder precursor titanium powder reacts with titanium diboride to form a titanium monoboride as indicated by Equation 4.

$$Ti + TiB_2 \rightarrow 2TiB \tag{4}$$

The pressure and temperature can then be reduced to allow the titanium monoboride article to cool. A monolithic titanium monoboride can thus be recovered which is substantially free of titanium diboride. Further, the titanium monoboride whiskers can be present at a volume content greater than about 80% in accordance with the principles of the present invention.

Depending on the powder precursor composition and the process conditions used in forming the titanium monoboride articles of the present invention, the flexure strength can generally range from about 550 MPa to about 990 MPa, and preferably from about 650 MPa to about 950 MPa. The hardness of the titanium monoboride can range from 1400 Kg/mm$^2$ to about 2000 Kg/mm$^2$, and in some cases about 1600 Kg/mm$^2$ to 1800 Kg/mm$^2$, measured by the Vickers technique. The method and materials used to form the titanium monoboride articles can be adjusted to tailor strength and hardness to a particular application. For example, bearings and nozzles may favor higher hardness, while sacrificing strength whereas high impact cutters, grinding tools, and armor may favor increased strength over hardness.

Several non-limiting examples of suitable applications which can incorporate the nanostructured titanium monoboride monolithic material of the present invention can include, but is in no way limited thereto, bearings, tribological surfaces, grinding media, armor, dies, insets, heating elements, crucibles, nozzles, electrodes, and other shaped commercial products.

The following examples illustrate exemplary embodiments of the invention. However, it is to be understood that the following is only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following example provides further detail in connection with what is presently deemed to be a practical embodiment of the invention.

EXAMPLES

Example 1

A powder mixture of titanium diboride (TiB$_2$) powder, titanium (Ti) powder and an iron-molybdenum alloy (FeMo) powder were used to synthesize the nanostructured monolithic titanium boride (TiB). FeMo alloy powder is employed as the densifier.

Table 1 provides a compilation of the Ti—TiB$_2$—FeMo compositions (wt. %) that have been synthesized in the laboratory. All the compositions contain 15 grams of the densifier, Fe—Mo, but with different proportions of Ti and TiB$_2$ powders to identify correlations of various properties.

TABLE 1

| Compositions Ti—TiB$_2$—FeMo (grams) | Sample Identity |
|---|---|
| 135-159-15 | SM 19 |
| 140-159-15 | SM 16 |
| 145-159-15 | SM 18 |
| 152-159-15 | SM 12 |
| 157-159-15 | SM 11 |
| 162-159-15 | SM 9 |

The powder mixture uses titanium powders of average size of −325 mesh (particle sizes including 45 μm and below and chemical composition in wt. %: 0.23 O, 0.02 N, 0.01 C, 0.04 Fe, and 0.024 H; balance Ti), titanium diboride powders of average size 2 μm (chemical composition in wt. %: 30.3 B, 0.67 Zr, 0.01 C, 0.04 Fe, and 0.024 H, and balance Ti) and FeMo alloy powders of size 5-7 μm. The chemical composition of FeMo alloy powder was: Fe-59.8 wt. % Mo. Similar densifier compositions such as Fe-50Mo and Fe-70Mo can also be used with some modification to process temperature and time. Use of this combination of powders also results in a nearly trimodal powder packing arrangement, and places much less stringent requirements on powders. For example, the titanium powders of −325 mesh, which are commercially readily available can be used without resorting to two different sized titanium powders. The use of Fe—Mo alloy powder as an activating agent helps the diffusion of titanium and boron atoms in the reaction to convert substantially the entire reacting mass to titanium monoboride.

The reaction sintering process was performed in a single heating and pressure step. The blended and packed powder mixture was placed in a 30 ton vacuum hot press in a graphite die. The blended powders were loaded into the die with GRAFOIL sheets as liners along the die walls. The hot press chamber was then evacuated using a rotary pump and refilled with commercially pure argon. The evacuation and refilling procedure was repeated three times to remove any residual O$_2$ and N$_2$ in the chamber. The die assembly with the powder was then heated at a rate of 30° C./min to 1300° C., which is the temperature at which the blended Ti and TiB$_2$ powders react to form the TiB whiskers. Upon reaching 1300° C., a pressure of about 28 MPa was applied and held for two hours at this temperature. Small changes in temperature (e.g. +/−50° C.) and pressure (+/−2 MPa) are not likely to change the final result greatly, although care should be taken to eliminate residual titanium diboride. The die was subsequently cooled slowly to room temperature and a dense, monolithic TiB material was ejected out of the die. The material was ready for preparation into desired components without any further treatment or processing. This material can be machined via electro-discharge machining (EDM) processes.

Figure 4A:
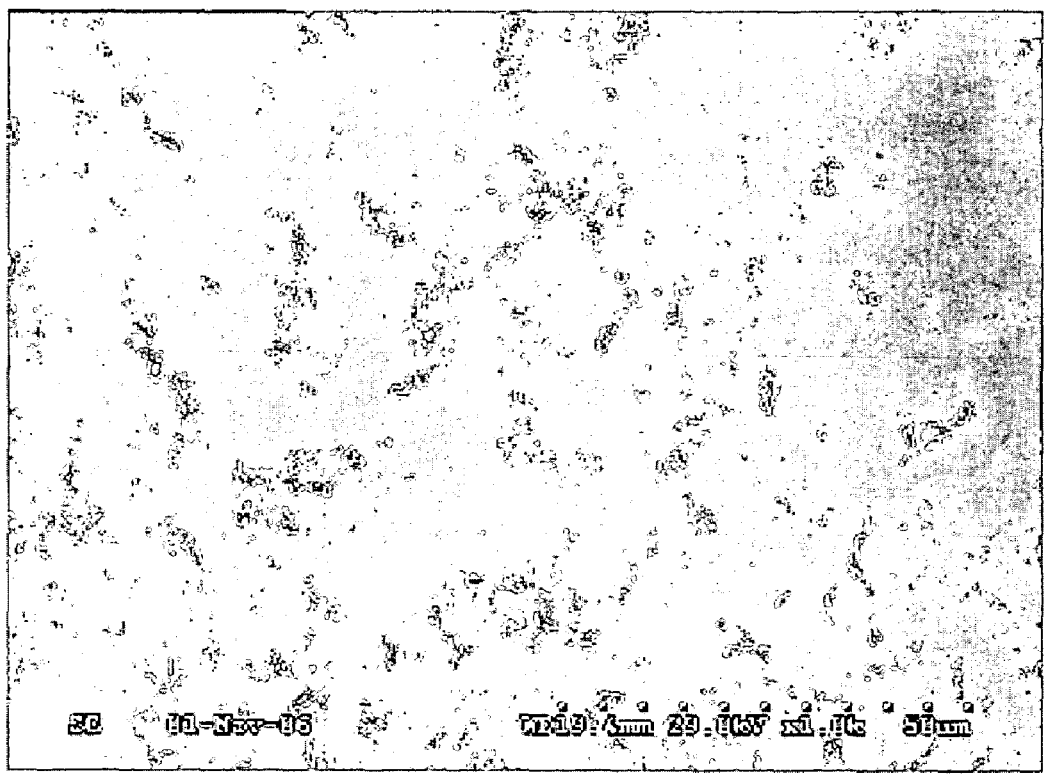
FIGS. 4A and 4B illustrate the microstructure of the nanostructured titanium boride made with the powder composition of Ti—TiB$_2$—FeMo: 157-159-15 (grams) magnified at 1000× and 2000×, respectively, in accordance with an embodiment of the present invention.
Figure 4B:
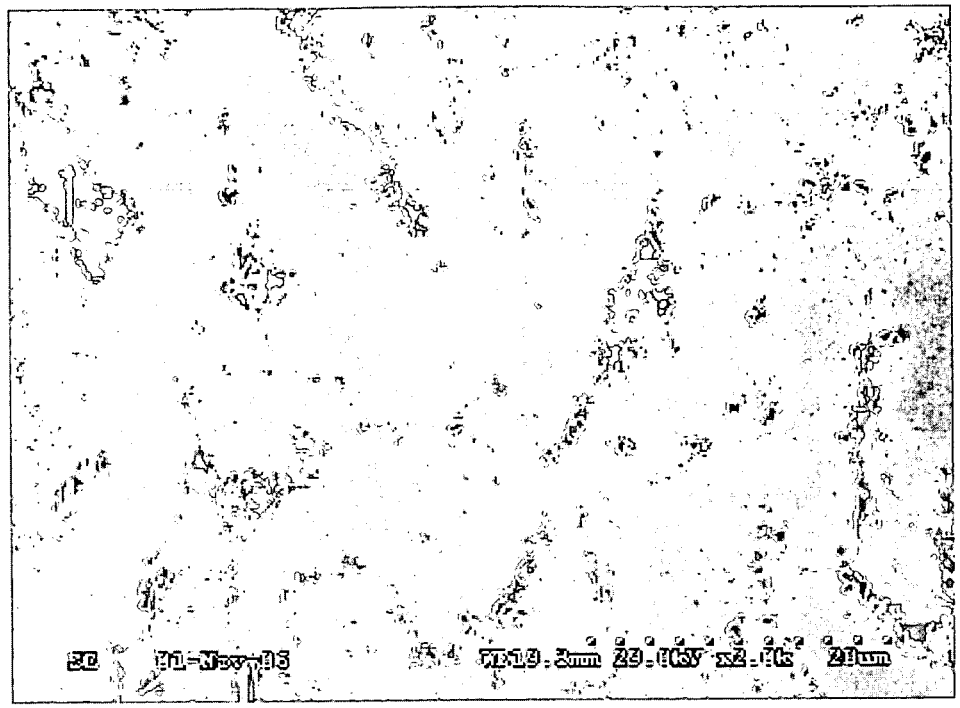
Figure 5A:
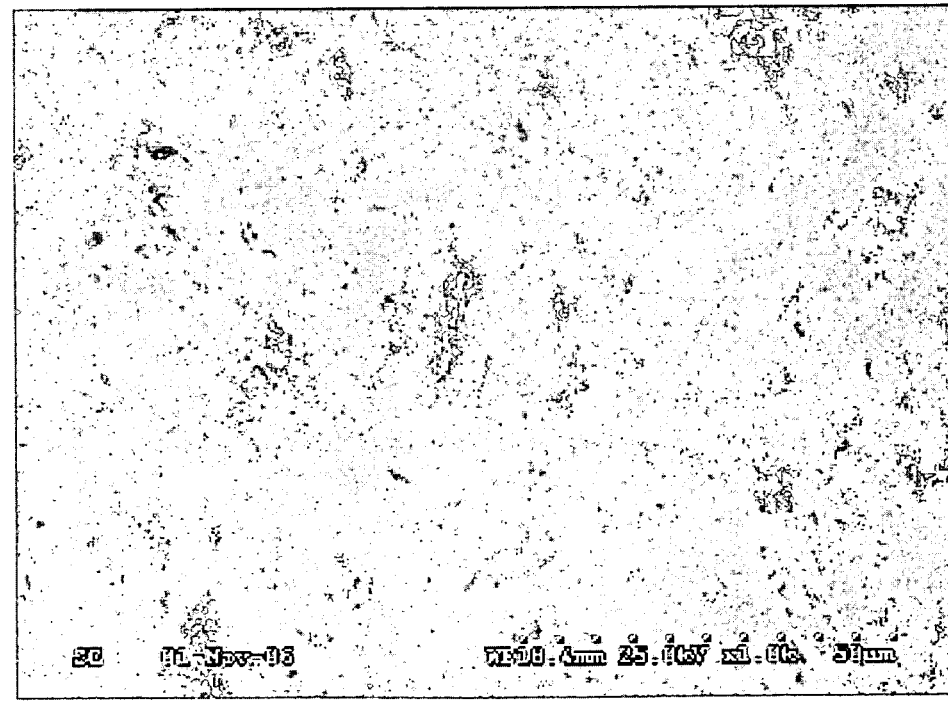
FIGS. 5A and 5B illustrate the microstructure of the nanostructured titanium boride with the composition of Ti—TiB$_2$—FeMo: 135-159-15 (grams), magnified at 1000× and 2000×, respectively, in accordance with an embodiment of the present invention.
Figure 5B:
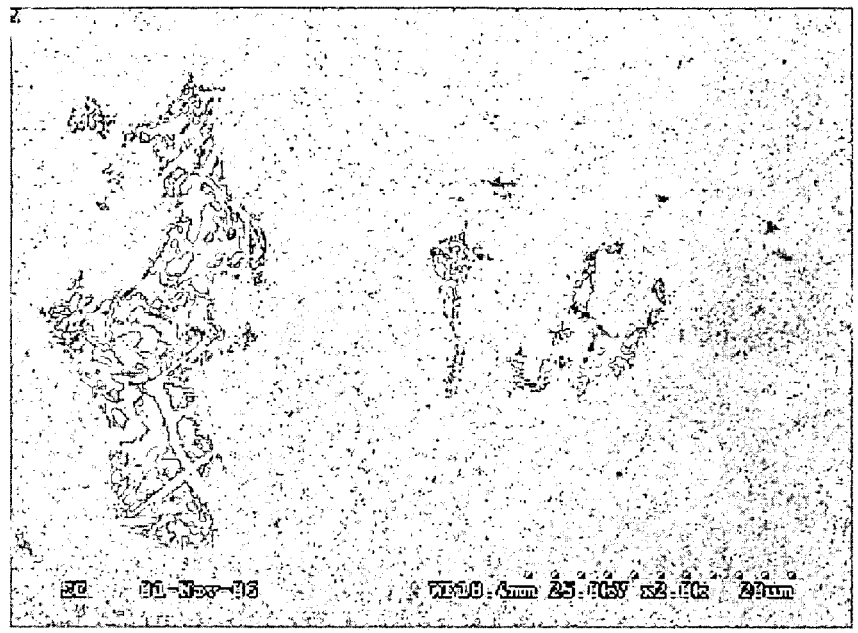

FIGS. 4A and 4B are SEM pictures of microstructures in the nanostructured titanium boride made with a powder composition of Ti—TiB$_2$—FeMo: (SM 11) at 1000× and 2000×, respectively. FIGS. 5A and 5B are SEM pictures of microstructures of nanostructured titanium boride made with a powder composition of Ti—TiB$_2$—FeMo: (SM 19) at 1000× and 2000×, respectively. These pictures indicate the nanostructure, the high degree of densification and intergrowth of the titanium monoboride whiskers.

One advantage of this choice of materials is that the use of FeMo as a densifier allows for less rigorous titanium particle size choice, but uses readily obtainable titanium and titanium diboride powders. This is advantageous, because detailed particle size classification can be avoided and the overall cost of the process can be reduced. One role of the Fe—Mo alloy powder is to produce a liquid phase around 900° C. which is maintained at higher temperatures, even beyond the typical hot pressing temperature of 1350° C. Without being bound to any particular theory, Fe—Mo particles appear to act as "proximal" particles primarily adjacent to titanium particles, thus helping in the formation of the liquid phase. The liquid phase enables faster inter-diffusion of titanium and boron atoms and helps convert the material to nanostructured titanium boride quickly, eliminating the need for trimodal packing. Another advantage is that the densifier enables a variation of the amount of titanium in the final compact in order to achieve optimum balance of strength and hardness, while retaining a very high percentage of TiB in the material.

Figure 6:
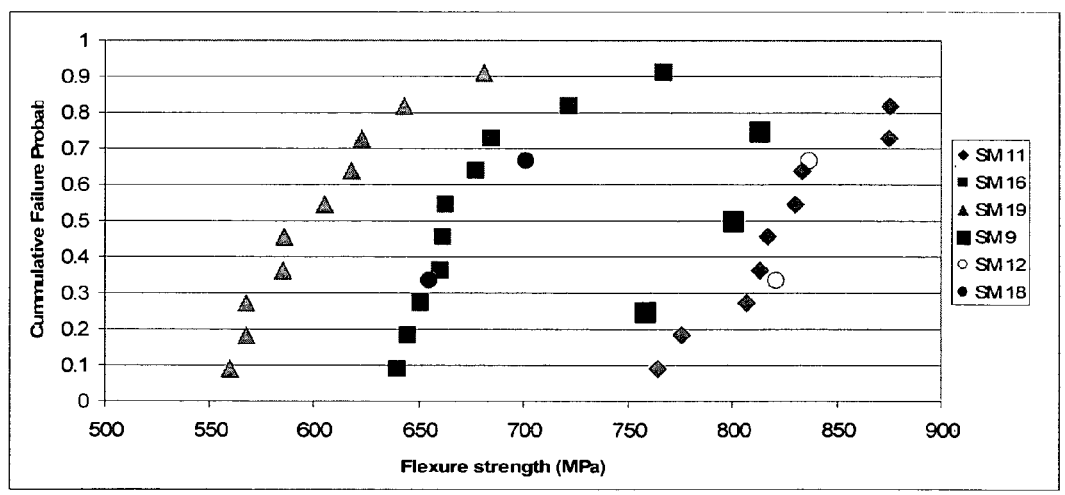
FIG. 6 is a graph of strength distribution for nanostructured titanium boride materials made with different compositions of powders, which are listed in Table 1, in accordance with several embodiments of the present invention.

FIG. 6 illustrates the distribution of flexural strengths for several nanostructured titanium boride materials made with the powder compositions in Table 1. All of the tested samples provided high strength greater than 550 MPa, although the highest strength was achieved with the powder composition of SM 11.

Figure 7:
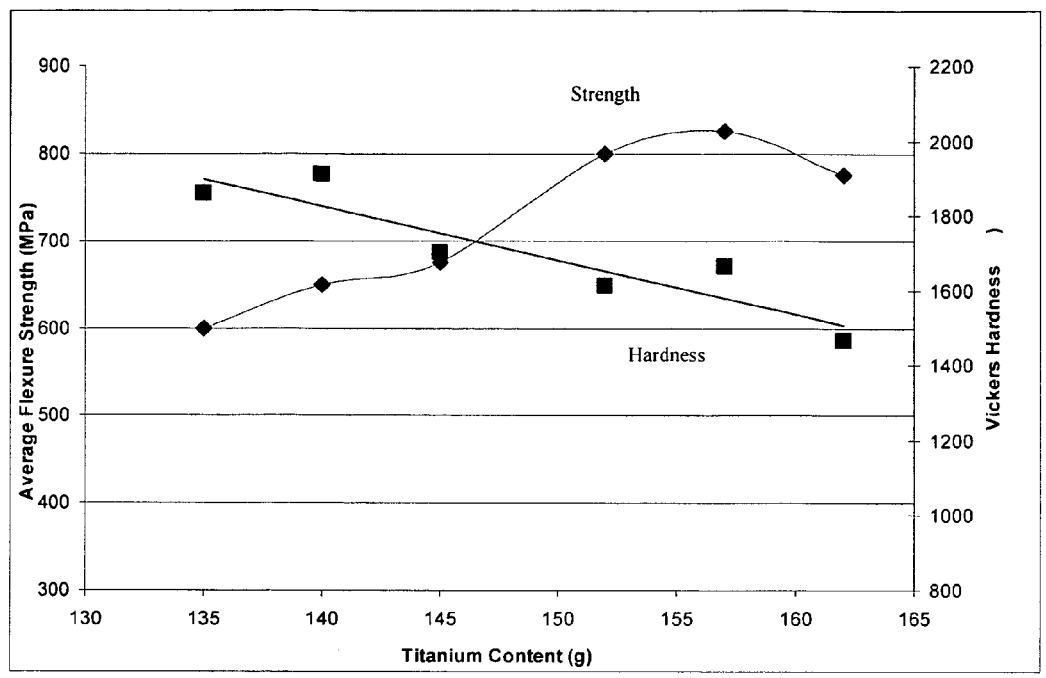
FIG. 7 is a graph of strength and hardness variation in the nanostructured titanium boride as a function of the titanium content in the powder mixture for samples listed in Table 1 in accordance with several embodiments of the present invention.

FIG. 7 illustrates the average mechanical properties of the nanostructured titanium boride (TiB) made with different proportions of titanium powder (−325 mesh) and with 159 g of 2 μm TiB$_2$ powder and 15 g of 5-7 μm Fe—Mo powder as listed in Table 1. Average flexural strength levels (determined from the data in FIG. 5) vary from about 600 MPa to about 850 MPa as the titanium powder content is varied from 135 g to 157 g. The highest average strength (about 850 MPa) is achieved in the Ti—TiB$_2$—FeMo composition: 157-159-15 g (SM 11). The hardness varies from about 2000 VHN to about 1500 VHN as the titanium powder content is varied from 135 g to 162 g. It can be seen that the strength and hardness levels vary slightly and inversely, offering some room to tailor the properties of the material for a given application.

Figure 8:
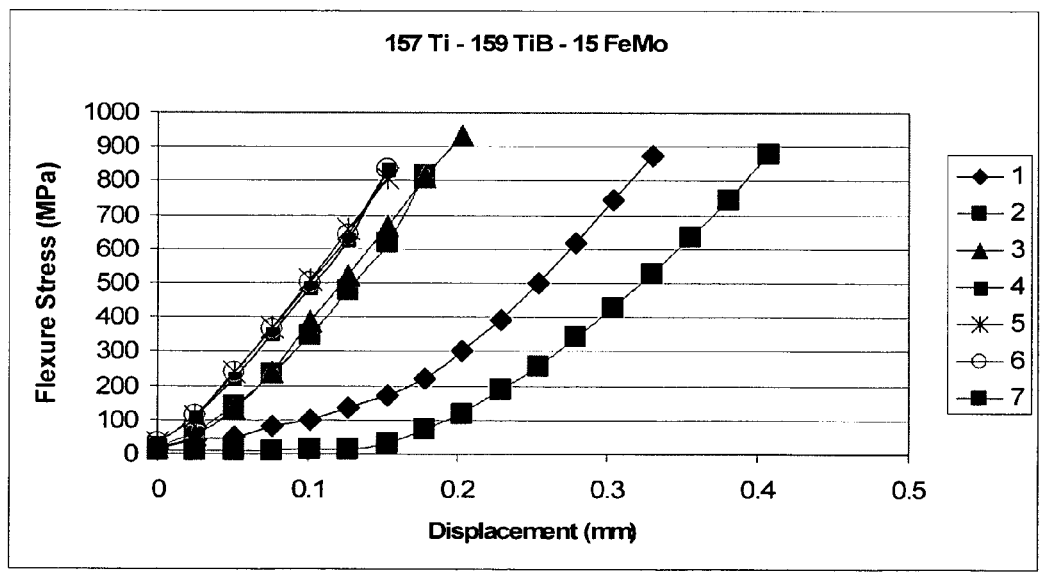
FIG. 8 illustrates actual load-displacement traces of the flexural strength tests for the composition of Ti—TiB$_2$—FeMo: 157-159-15 (grams) (SM 11) in accordance with an embodiment of the present invention.

FIG. 8 shows a graph of load-displacement traces for the highest strength nanostructured titanium boride made from the powder composition of SM 11. The numbers refer to repeated tests. The displacements at fracture vary from 0.15 to 0.4 mm because of the variations in the initial contact conditions (compliant or rigid) of the loading points of the fixture in which the tests were conducted. Such variations are routine and do not reflect on the performance of the material.

Example 2

Figure 9A:
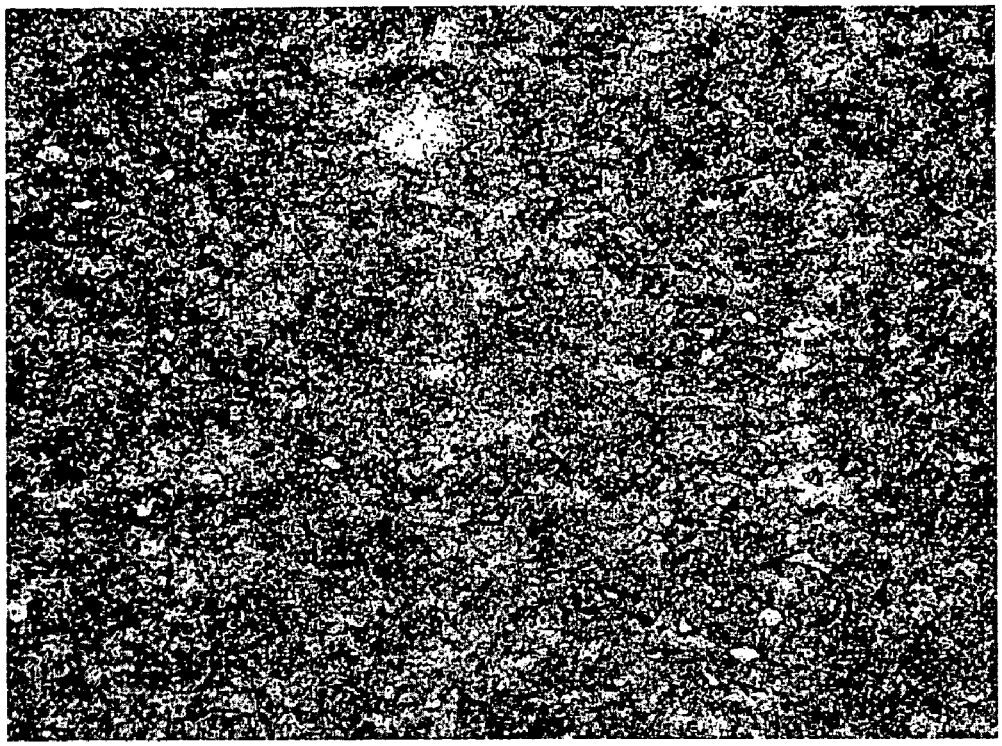
FIGS. 9A and 9B are optical pictures of microstructures for nanostructured titanium boride made with a powder composition of Ti—TiB$_2$—FeMo: 157-159-15 (grams); (a) at 200× and (b) at 1000× in accordance with an embodiment of the present invention.
Figure 9B:
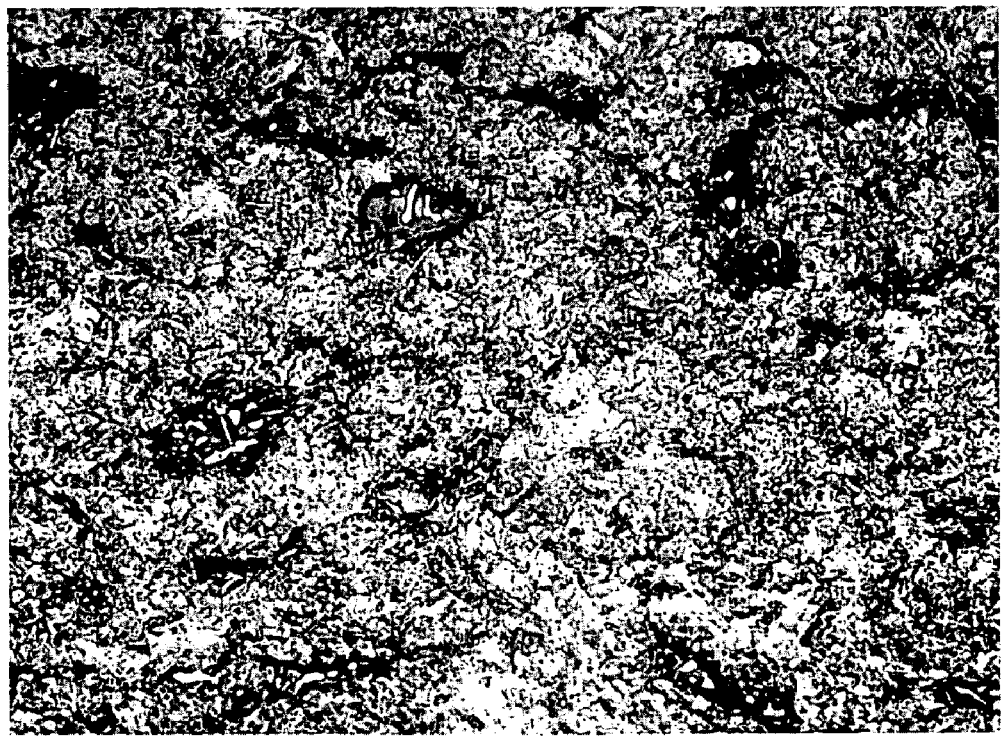

A powder mixture was made of titanium diboride (TiB$_2$) powder, titanium (Ti) powder and an iron-molybdenum alloy (Fe—Mo) powder to synthesize the nanostructured monolithic titanium boride (TiB). The same powders were used as in Example 1, except both the titanium and the titanium diboride powders were −325 mesh (sizes of 45 μm and below including different proportions of particle sizes down to about 1 μm), which are readily commercially available forms. A composition of Ti—TiB$_2$—FeMo: 157-159-15 (grams) was used to synthesize the nanostructured titanium boride under the same conditions as in Example 1. The resulting material was microstructurally quite similar to the material made in Example 1, and is expected to exhibit similar properties. FIGS. 9A and 9B are optical pictures (magnified at 200× and 1000×, respectively) of the microstructures for the nanostructured titanium boride synthesized which illustrate more clearly the network of whiskers which comprise the bulk of the material.

Example 3

Preparation

A nanostructured titanium monoboride was manufactured by carefully controlled reaction sintering of a tri-modal distribution of Ti and TiB$_2$ powders. The relative powder sizes were important in obtaining the desired nanostructure in the final TiB material. A bi-modal titanium powder mixture having an average size of 45 μm and 7 μm and a composition of (wt. %) 0.23 O, 0.02 N, 0.01 C, 0.04 Fe, and 0.024 H and titanium diboride powders having an average size of 2 μm and a composition of (wt. %) 30.3 B, 0.67 Zr, 0.01 C, 0.04 Fe, and 0.024 H were provided. The titanium powder and titanium diboride powders were mixed together at 49 wt % Ti (41±2 wt % of 45 μm size and 9±1 wt % of 7 μm size powder) and 51 wt % TiB$_2$. The powders were then thoroughly blended for 24 hours in a rotary blender with steel balls to ensure homogeneity of the mixture. These powders have a size ratio of 45:7:2, and a packing density of about 90% in the blended state, which was found to be important in achieving the desired nanostructure.

The reaction sintering process can be performed in a single heating and pressure step. The blended and packed powder mixture was placed in a 30 ton vacuum hot press in a graphite die. The blended powders were loaded into the die with GRAFOIL sheets as liners along the die walls. The hot press chamber was then evacuated using a rotary pump and refilled with commercially pure argon. The evacuation and refilling procedure was repeated three times to remove any residual O$_2$ and N$_2$ in the chamber. The die assembly with the powder was then heated at a rate of 30° C./min to 1300° C., which is the temperature at which the blended Ti and TiB$_2$ powders react to form the TiB whiskers. Upon reaching 1300° C., a pressure of about 28 MPa was applied and held for two hours at this temperature. Small changes in temperature (e.g. +/−50° C.) and pressure (+/−2 MPa) are not likely to change the final result greatly, although care should be taken to eliminate residual titanium diboride. The die was subsequently cooled slowly to room temperature and a dense, monolithic TiB material was ejected out of the die. The material was ready for preparation into desired components without any further treatment or processing. This material is particularly suited to machining via electro-discharge machining (EDM) processes.

Evaluation and Testing

Figure 10A:
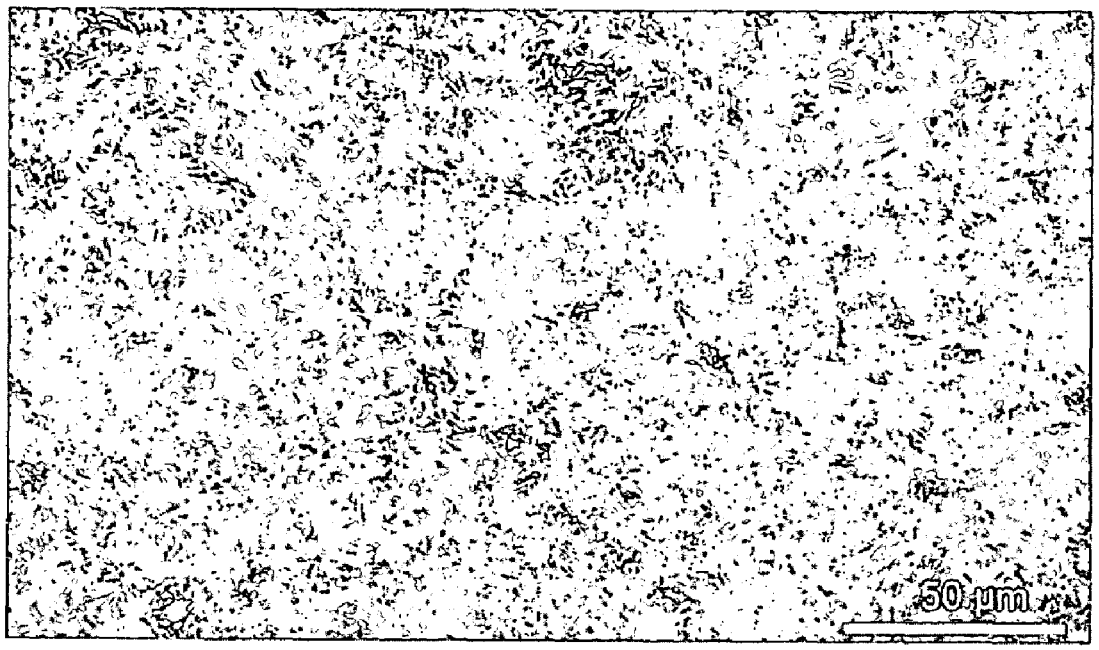
FIG. 10A shows a micrograph of a titanium monoboride material in accordance with an embodiment of the present invention.
Figure 10B:
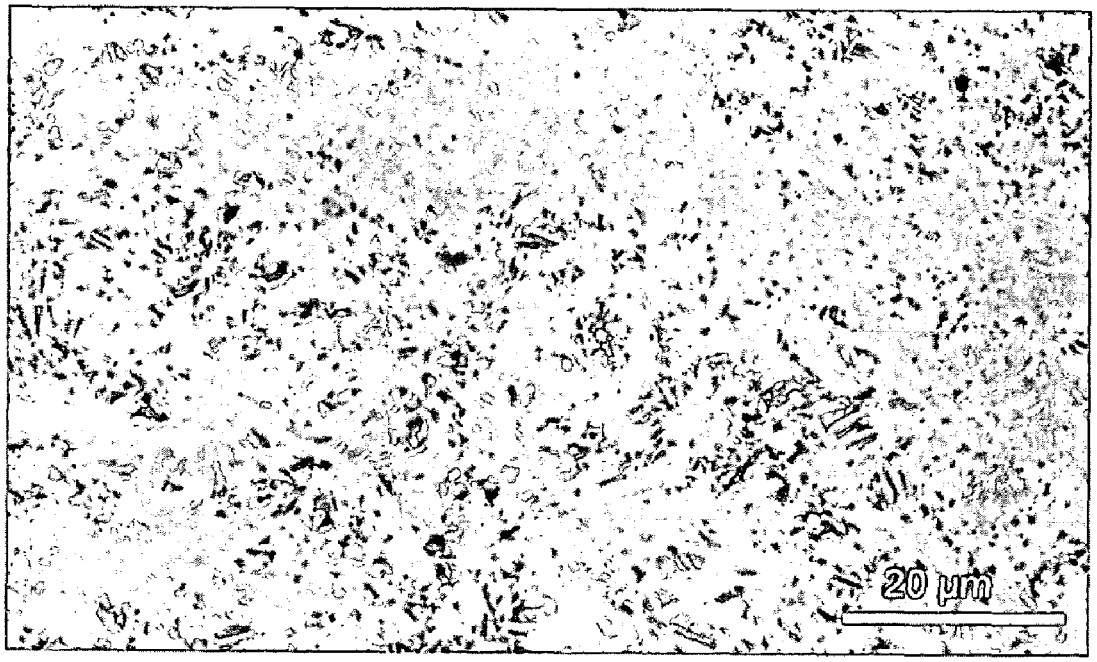
FIG. 10B shows a micrograph of the titanium monoboride material of FIG. 10A at a higher magnification.

FIGS. 10A and 10B illustrate the nanostructures of the titanium monoboride material. The micrographs were taken in a scanning electron microscope after polishing using diamond compounds/disks and deep etching with Kroll's reagent. The microstructure consists of bundles of extremely thin-sized whiskers. The individual rod-like features are the nanostructured TiB whiskers. The nanostructured nature of this TiB article is clearly evident in the micrographs, although the most of the individual rods are not entirely distinguishable due to the limitations of resolution in the scanning electron microscope in which these images were taken. The volume fraction of titanium monoboride, estimated from X-ray diffraction varied from 86-95%, with the reminder being Ti.

The long needle-like features are the TiB whiskers that formed as a result of the reaction between Ti and TiB$_2$ particles in the powder precursor mixture. The darker regions represent the residual titanium (anywhere between 5-9%, estimated from X-ray diffraction, depending on location) that acts as a binder of the TiB whiskers.

Four-point flexural strength tests were conducted in an Instron mechanical testing machine. The size of the samples was approximately 25 mm×6 mm×5 mm. The samples were cut from the reaction sintered plate by EDM machining. Subsequently, the samples were ground using 220 grit diamond wheel to remove surface layers about 0.25 mm depth from the EDM surface. The samples were polished further using a 35 micron diamond disk, followed by fine polishing through 10, 6 and 3 micron suspensions sequentially. The flexure strength tests were conducted in four-point bending at a displacement loading rate of 0.2 mm/sec. For comparison, specimens from commercial TiB$_2$ plate were also cut, prepared and tested in an identical manner.

Figure 11:
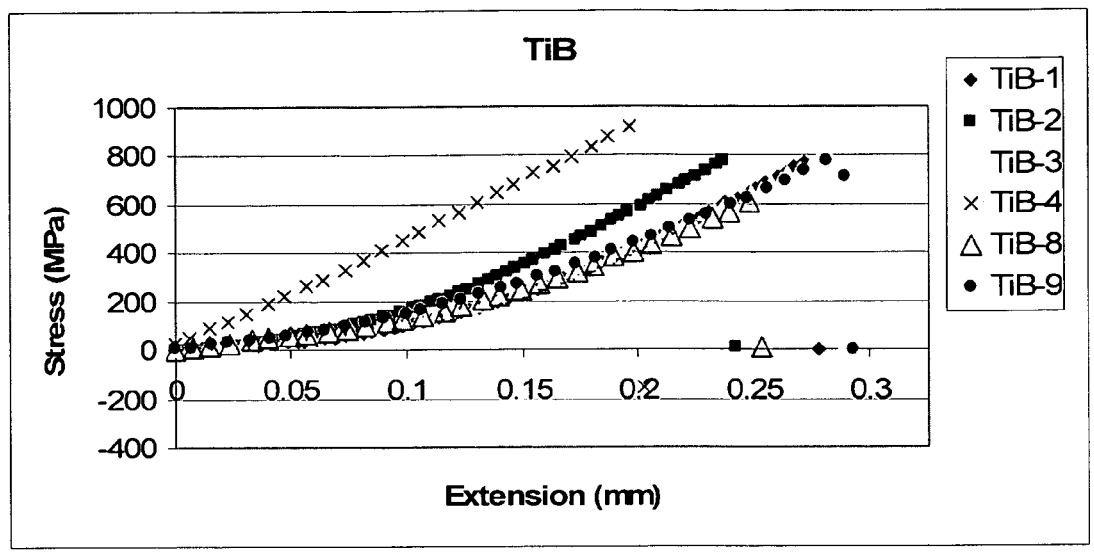
FIG. 11 is graph of stress versus extension in load displacement results of eight different titanium monoboride articles in bending flexure tests for the material shown in FIGS. 10A and 10B.
Figure 12:
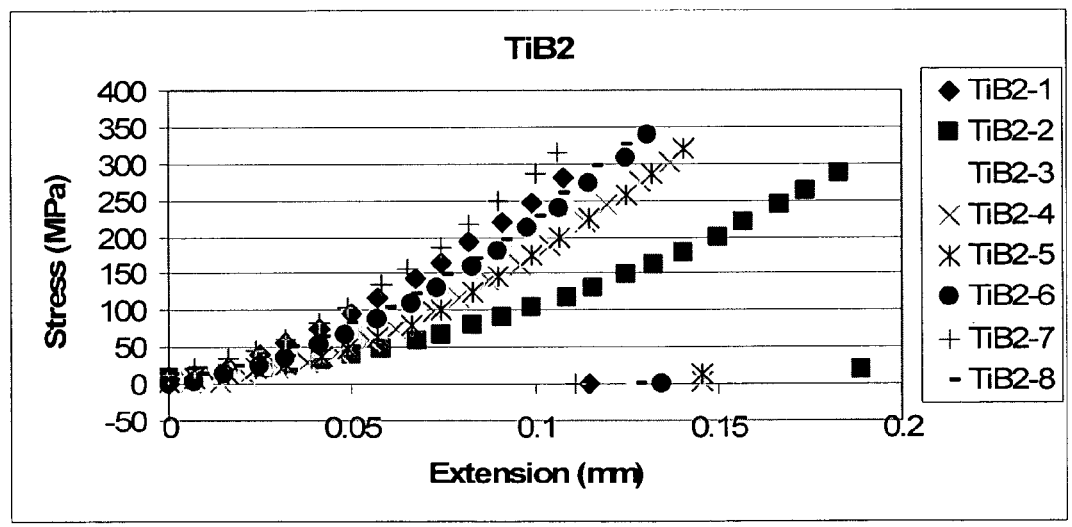
FIG. 12 is graph of stress versus extension in load displacement results of eight different commercial titanium diboride articles in bending flexure tests.

FIG. 11 presents the stress-displacement plots of tests of several specimens from the nanostructured titanium monoboride material. FIG. 12 presents the same test results for the commercial TiB$_2$ material. It can be seen that the ultimate failure stresses for the specimens of nanostructured TiB are about two to three times higher than the corresponding loads for the TiB$_2$ specimens.

Figure 13:
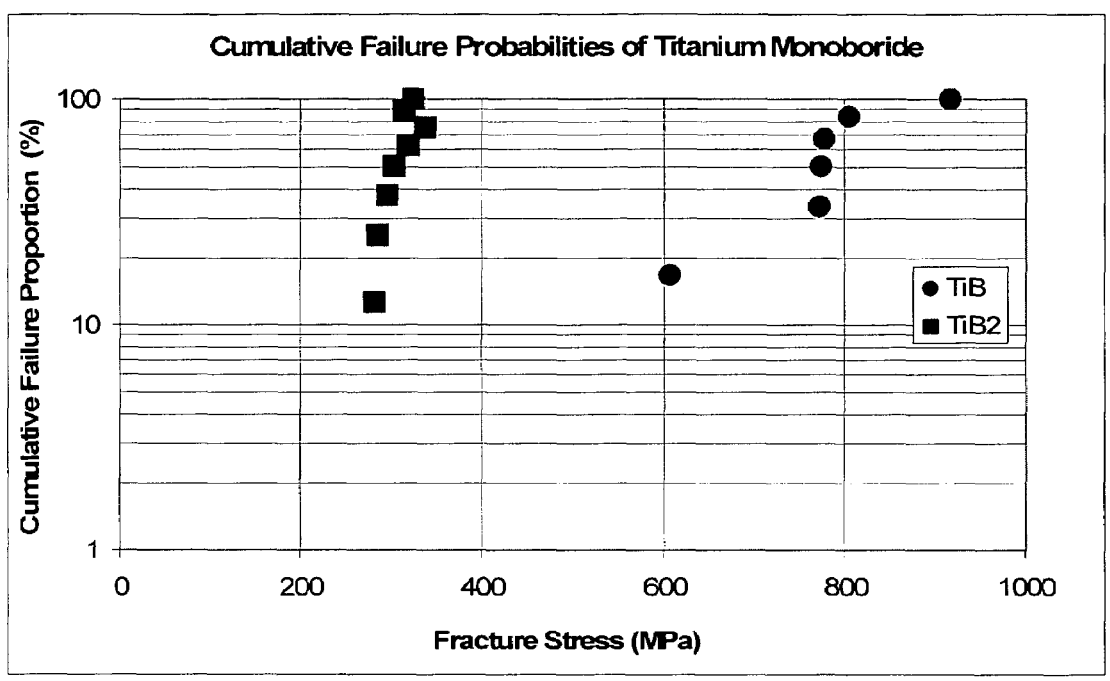
FIG. 13 is a graph of cumulative failure probabilities versus fracture stress for titanium monoboride articles of the present invention and several commercial titanium diboride samples which highlight the contrast in increased strength in the titanium monoboride.

The flexural strength levels for both materials are plotted in the form of a cumulative failure probability distribution in FIG. 13. Based on these results, the flexure strength levels of nanostructured TiB material is, on average, about three times higher than the commercial TiB$_2$ material. This is somewhat unexpected due to fact that bulk titanium diboride, TiB$_2$ is a harder material than bulk titanium monoboride, TiB. However, the nanostructure refinement achieved in the titanium monoboride articles of the present invention, yielding a whiskered nanostructure clearly makes the material much stronger than TiB$_2$. The grain size of TiB$_2$ used for comparison in FIG. 13, is in the range of 5-10 microns.

It is to be understood that the above-referenced arrangements are illustrative of the application for the principles of the present invention. Thus, while the present invention has been described above in connection with the exemplary embodiments of the invention, it will be apparent to those of ordinary skill in the art that numerous modifications and alternative arrangements can be made without departing from the principles and concepts of the invention as set forth in the claims.

What is claimed is:

1. A monolithic titanium monoboride article, comprising titanium monoboride whiskers and a densifier, said titanium monoboride whiskers being present at a volume content greater than about 80% and said article being substantially free of titanium diboride, wherein said monolithic titanium monoboride article has a flexure strength from about 500 MPa to about 950 MPa.

2. The article of claim 1, wherein the article consists essentially of the titanium monoboride whiskers, densifier, and titanium.

3. The article of claim 1, wherein the titanium monoboride whisker volume content is from about 85% to about 95%.

4. The article of claim 1, wherein said titanium monoboride whiskers have a nanostructure wherein the average length of the titanium monoboride whiskers is from about 1 μm to about 700 μm and the average diameter of the titanium monoboride whiskers is about 10 nm to about 900 nm.

5. The article of claim 1, wherein the titanium monoboride article is electrically conductive.

6. The article of claim 1, wherein the densifier comprises iron and molybdenum.

7. The article of claim 1, wherein the densifier includes a metal, a combination of metals, or an alloy which forms a eutectic liquid at temperatures from about 600° C. to about 1300° C.

8. A method of forming a monolithic titanium monoboride having a whisker nanostructure, comprising the steps of:
    a) forming a powder precursor including titanium powder, titanium diboride powder and densifier powder, said powder precursor having a titanium powder to titanium diboride powder weight ratio from about 0.85:1 to about 1.2:1;
    b) maintaining the powder precursor under a temperature and pressure sufficient to grow titanium monoboride whiskers, said temperature being about 1100° C. to about 1400° C.; and
    c) recovering the monolithic titanium monoboride being substantially free of titanium diboride, said titanium monoboride whiskers being present at a volume content greater than about 80% and having a flexure strength from about 500 MPa to about 950 MPa.

9. The method of claim 8, wherein the weight ratio is from about 0.9:1 to about 1.1:1.

10. The method of claim 9, wherein the weight ratio is about 0.96:1.

11. The method of claim 8, wherein the powder precursor includes a multimodal distribution of particles sizes formed of a quantity of the titanium powder, a quantity of the densifier powder, and a quantity of the titanium diboride powder in a size ratio of X:Y:Z, respectively, where X is from about 20 to about 100, Y is from about 2 to about 15, and Z is about 0.5 to about 55.

12. The method of claim 11, wherein X is from about 35 to about 55, Y is from about 2 to about 15, and Z is from about 1 to about 5 such that the multimodal distribution is a trimodal distribution.

13. The method of claim 11, wherein Z and X are substantially the same such that the multimodal distribution is a bimodal distribution.

14. The method of claim 11, wherein a ratio of X:Y is from about 5:1 to about 8:1.

15. The method of claim 11, wherein the multi-modal size distribution is determined by optimizing packing density to within about 5% of a theoretical maximum.

16. The method of claim 8, wherein the densifier includes a metal, a combination of metals, or an alloy which forms a eutectic liquid at temperatures from about 600° C. to about 1300° C.

17. The method of claim 8, wherein the densifier includes iron and molybdenum.

18. The method of claim 8, wherein the step of maintaining is performed for a process time from about half a theoretical time to about 1.2 times the theoretical time, said theoretical time, t, being calculated from the following two equations:

$$x = k\sqrt{t} \text{ and } k = k_o \exp\left(\frac{-Q_k}{2RT}\right)$$

where x is titanium monoboride whisker length, $k_O$ is frequency factor, $Q_k$ is activation energy of whisker growth, T is the temperature, and R is the universal gas constant.

19. The method of claim 8, further comprising the step of heating the powdered precursor to the temperature at a rate of about 30° C./minute prior to the step of maintaining.

20. The method of claim 8, further comprising the step of electro-discharge machining the monolithic titanium monoboride subsequent to the step of recovering to form a shaped commercial product.

21. The method of claim 8, wherein the powder precursor has a densifier to titanium ratio of about 0.09 to about 1.1.

* * * * *